US006737173B2

(12) United States Patent
Iyoda et al.

(10) Patent No.: US 6,737,173 B2
(45) Date of Patent: May 18, 2004

(54) PRETREATING METHOD BEFORE PLATING AND COMPOSITES HAVING A PLATED COAT

(75) Inventors: Ken Iyoda, Shiojiri (JP); Susumu Shimada, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/400,817

(22) Filed: Mar. 27, 2003

(65) Prior Publication Data

US 2003/0186071 A1 Oct. 2, 2003

(30) Foreign Application Priority Data

Mar. 29, 2002 (JP) ......................... 2002-094821

(51) Int. Cl.⁷ ..................... C23C 18/32; C23C 18/18; B05D 3/00; B05D 5/00; B32B 15/00
(52) U.S. Cl. .................. 428/615; 428/620; 428/650; 428/652; 428/539.5; 427/304; 427/305
(58) Field of Search ................. 428/615, 620, 428/650, 652, 539.5; 427/304, 305

(56) References Cited

U.S. PATENT DOCUMENTS

| | | | | |
|---|---|---|---|---|
| 5,079,040 A | * | 1/1992 | Brandenburger | 428/305 |
| 5,455,118 A | * | 10/1995 | Cook | 428/555 |
| 5,730,853 A | * | 3/1998 | Smith et al. | 205/210 |

FOREIGN PATENT DOCUMENTS

| | | | |
|---|---|---|---|
| DE | 4201129 | * | 7/1992 |
| FR | 2748754 | * | 11/1997 |
| JP | 54-23610 | * | 2/1979 |
| JP | 57-76196 | * | 5/1982 |
| JP | 60-32209 | * | 2/1985 |
| JP | 63-20486 | * | 1/1988 |
| JP | 11-209879 A | | 8/1999 |

* cited by examiner

Primary Examiner—Deborah Jones
Assistant Examiner—Jason Savage
(74) Attorney, Agent, or Firm—Frishauf, Holtz, Goodman & Chick, P.C.

(57) ABSTRACT

The surface to be plated of a composite made of a metallic and a non-metallic material is degreased and otherwise cleaned and immersed in a palladium activator fluid conditioned with a hydrogencarbonate to a pH of 2~5. After this pretreating process, the composite is plated with a metal and becomes most suitable for use as a material for heat sink on hybrid ICs since it can be efficiently soldered and has better corrosion resistance.

16 Claims, No Drawings

PRETREATING METHOD BEFORE PLATING AND COMPOSITES HAVING A PLATED COAT

BACKGROUND OF THE INVENTION

This invention relates to a pretreating method before plating, in particular, to a method of pretreating composites of a metallic and a non-metallic material, as well as composites of a metallic and a non-metallic material having a highly adherent coat plated thereon. The invention further relates to platings that can be applied to electronic materials as for heat sinks and which have sufficient reliability to withstand installation on vehicles.

In the prior art, metals such as Al need to be soldered to hybrid IC boards if they are to be used as for heat sinks and to this end, a plating is applied to the metal surface. Plating is also required if composites comprising metals such as Al and Mg that are reinforced with non-metals such as SiC, $Al_2O_3$, AlN and C are to be used for heat sinks. Unless the platings are uniform and have good adhesion, they cannot exhibit the intended effect due, for example, to the separation of the IC board from the soldered metal together with the plating. A method that can apply reliable and uniform platings to composites of a metallic material (e.g. Al) and a non-metallic material is yet to be established on a commercial scale. Described below are the conventional methods for plating metallic materials (e.g. Al) or non-metallic (non-conductive) materials (e.g. ceramics) individually, as well as for plating composites.

For plating metallic materials such as Al and Mg, preliminary treatments such as etching and pickling are first performed and then the zincate conversion process is applied, which comprises treatment in a bath based on an alkali solution of zinc oxide so as to remove the thin oxide film from the surface while at the same time zinc is substitution precipitated to form a highly adherent zinc film as an intermediate layer, followed by Ni or otherwise plating.

If the non-metallic material is a non-conductive material such as ceramics or plastics, it is first immersed in a colloidal solution (catalyst fluid) based on palladium chloride and tin chloride, then immersed in an acid (sulfuric acid or hydrochloric acid) solution (accelerator fluid) to activate palladium so that palladium nuclei are deposited on the surface to be plated, then followed by electroless Ni plating or otherwise to have a conductive coat precipitated around the deposited palladium nuclei. In another method, the substrate is first immersed in a hydrochloric acid solution containing tin chloride (sensitizer fluid) so that tin is adsorbed on the hydrophilized surface; the substrate is then immersed in a palladium activating fluid comprising palladium chloride (activator fluid) so that a redox reaction is initiated to form palladium nuclei on the surface, then followed by electroless Ni plating or otherwise to have a conductive coat precipitated around the deposited palladium nuclei as in the first method.

Speaking of composites having ceramics (e.g. silicon carbide) or non-metallic (non-conductive) materials (e.g. carbon) added to metallic materials (e.g. Al), it has recently been proposed that the work be immersed in a neutral (pH 5–9) aqueous colloidal palladium solution, preferably after a zincate conversion process is performed, so as to provide enhanced adhesion before electroless plating is performed (Japanese Patent Laid-Open No. 209879/1999).

In order to ensure that plating exhibits the intended effect, a uniform and highly adherent plated coat must be formed. However, if the above-described prior art techniques are employed to perform electroless plating after preliminary treatments on composites of metallic materials (e.g. Al) and non-metallic (non-conductive) materials (e.g. SiC), the following problems have occurred.

If the zincate conversion process is applied to a metallic material, a substitution of zinc for the metal occurs on its surface but only insufficient zinc substitution takes place on the surface of a non-metallic material. Therefore, the subsequently applied Ni plating will become mottled and no uniform coat is obtained. Even if you somehow managed to apply plating, the deposited coat would have very poor adhesion.

In the palladium activation process, the catalyst fluid, the accelerator fluid and the sensitizer fluid are generally acidic and based on chlorides, so if a metal or metals soluble in those acidic chloride solutions are contained in the metallic material of the composite material, the metallic material will dissolve partially and no uniform plating is possible.

In the case of treating the composite with neutral colloidal palladium, the processing solution is neutral and plating is performed without removing the surface oxide film, so there is a concern about adhesion. If more reliable plated coat having better adhesion is required, the zincate conversion process and the like must also be performed but this is not desirable from an economic viewpoint.

SUMMARY OF THE INVENTION

The present invention has been accomplished under these circumstances and has as an object providing an efficient and economical method of performing preliminary treatments before plating a composite of a metallic and a non-metallic material, in which only a small amount of the metallic material dissolves and palladium is also adsorbed uniformly on the non-metallic material to ensure the formation of a uniform and highly adherent plated coat.

Another object of the invention is to provide a composite of a metallic and a non-metallic material having a plated coat of strong adhesion on it.

The present inventors conducted intensive studies with a view to attaining the stated objects and found that the pH range is a crucial parameter to the treatment for palladium activation. Thus, according to its first aspect, the invention provides a pretreating method which comprises the steps of, before applying plating to a composite of a metallic and a non-metallic material, cleaning the surface of the composite to be plated and performing a treatment for palladium activation with a palladium activator fluid at a pH of 2–5.

In a preferred embodiment, the composite is a material for a heat sink on a circuit board.

In another preferred embodiment, the pH of the palladium activator fluid is adjusted with a hydrogencarbonate.

In yet another preferred embodiment, the plating is applied by electroless plating.

According to its second aspect, the invention provides a composite of a metallic and a non-metallic material to which plating has been applied and the plated coat has a peel strength of at least 400 g in a wire-bond pull test with an aluminum wire as applied to the plated coat by ultrasonic bonding.

According to its third aspect, the invention provides a composite of a metallic and a non-metallic material to which plating has been applied and the plated coat has a peel strength of at least 800 g in a wire-bond pull test with an aluminum wire as applied to the plated coat by ultrasonic bonding.

According to its fourth aspect, the invention provides a composite of a metallic and a non-metallic material to which plating has been applied and the plated coat, if it is subjected to a wire-bond pull test with an aluminum wire as applied to it by ultrasonic bonding, has a failure mode which involves break either in the loop or at the neck of the aluminum wire. In a preferred embodiment of the second to the fourth aspects of the invention, the plating is applied by electroless plating.

In another preferred embodiment, the plating is a Ni alloy plating.

In yet another preferred embodiment, a main component of the metallic material is Al, Mg, Cu or Fe and a main component of the non-metallic material is SiC, $Al_2O_3$, AlN or $Si_3N_4$.

In another preferred embodiment, the composite is a material for a heat sink on a circuit board.

THE PREFERRED EMBODIMENTS OF THE INVENTION

A composite of a metallic material (e.g. Al) and a non-metallic material (e.g. SiC) is prepared, degreased in a degreasing fluid comprising sodium borate, sodium phosphate, a surfactant, etc., washed with water, has the surface polished chemically in an acid-based chemical polisher comprising chromic acid, sulfuric acid, etc. and is washed again with water to get its surface clean. After this cleaning process, the composite is treated for palladium activation.

In the treatment for palladium activation, a mixed liquid is employed that comprises a palladium salt (based on palladium chloride) for the treatment of Al, an oxycarboxylate and 1.7% aqueous nitric acid containing hydrofluoric acid. This liquid has a comparatively high acid concentration but low palladium concentration, thus being categorized as a solution rather than a colloid. A commercial palladium activator liquid may also be employed.

According to the invention, an alkali agent is added to this liquid which serves as a processing fluid for palladium activation such that the pH of the liquid is raised to a specified range, whereby the amount of the metal dissolved from the composite is sufficiently reduced to assure efficient pretreatment. A preferred alkali agent for increasing the pH of the liquid is a hydrogencarbonate such as sodium hydrogencarbonate since this allows for easy pH adjustment.

It should, however, be noted that if the pH is raised to a neutral range, the adsorption of palladium is deteriorated and a coat of poor adhesion will be plated. Therefore, the pH of the activator fluid should be adjusted to lie within an appropriate acidic range. A particularly preferred pH range is between 2 and 5, where the balance between the adsorption of palladium and each of the amounts of the dissolved metal and the dissolved surface oxide film is good enough to produce plated coats of better adhesion. However, at pH below 2, more of the metal is dissolved to produce a plated coat that is poor in both uniformity and adhesion. At pH higher than 5, the adsorption of palladium is deteriorated.

Plating may be applied by electroplating but conventional electroless plating techniques including electroless Ni plating and electroless Cu plating may also be applicable. Electroless plating is more advantageous since there is no need to consider current density, bath voltage, their distributions and other parameters involved in electroplating and still a uniform coat can be obtained.

The foregoing description has been focused on Al as the metallic material in the composite but the present invention can equally be implemented on other metals such as Mg, Cu and Fe. The non-metallic material is preferably selected from ceramics including SiC, $Al_2O_3$, AlN and $Si_3N_4$.

The strength of plating adhesion is conventionally evaluated by a tape peel test but electronic components for vehicular installation that require particularly high reliability, as well as composite components such as heat sinks are required to have very high reliability in adhesion. In test methods devised to meet this requirement of electronic components, an aluminum wire bonded to the surface of a plated coat with an ultrasonic bonding machine is pulled to measure the peel strength or the adhesion of the plated coat is evaluated by failure mode in the wire-bond pull test.

If the plated coat has a tensile strength of at least 400 g, it can safely be used on electronic components; more preferably, it has a tensile strength of at least 800 g. A preferred failure mode is break either in the loop or at the neck of the aluminum wire; a break at the interface between the plated coat and the substrate surface or between the plated coat and the aluminum wire indicates that the plating has only poor adhesion or the wire bonding conditions are not appropriate. Note that the conditions for ultrasonic wire bonding must be optimized in consideration of various factors including the model of the bonding machine, the type of the plated coat, and the hardness of the substrate surface, which can be adjusted by any skilled artisan using any suitable method.

The following examples are provided for further illustrating the present invention but are in no way to be taken as limiting its technical scope.

EXAMPLE 1

An Al powder (99.9% pure sample of Kojundo Chemical Laboratory Co., Ltd.) and a SiC powder (#3000 of Wanami K. K. with an average particle size of 3 μm) were mixed in a mortar at a weight ratio of 7:3 for 10 minutes. The mixture was melted at 740° C. and cast into a slab which was a composite of Al and SiC. A test piece measuring 20 mm×15 mm×2 mm was cut out of the slab by means of a diamond cutter and designated No. 1.

This test piece was immersed in a degreasing fluid, a mixture of sulfuric acid and alkanesulfonic acid (LCL-1E of C. Uyemura & Co., Ltd.), at 40° C. for 2 minutes and thereafter washed with water at room temperature for 1 minute. The test piece was then immersed in an acid-based chemical polisher (AD-101F of C. Uyemura & Co., Ltd.) at 70° C. for 2 minutes and washed with water at room temperature for 1 minute to get its surface clean.

As a pretreating process, the following treatment for palladium activation was performed in an acidic range. To a palladium activator fluid containing palladium chloride and an oxycarboxylate (AT-360 of C. Uyemura & Co., Ltd.), a sodium hydrogencarbonate powder (product of Wako Pure Chemical Industries, Ltd.) was added until a pH meter read a pH of 2.0. The test piece was immersed in the thus conditioned activator fluid at room temperature for 2 minutes. Thereafter, the test piece was washed with water at room temperature for 1 minute.

After the pretreating, the test piece was immersed in NIMDEN SX of C. Uyemura & Co., Ltd. (electroless Ni plating bath containing nickel ions and hypophosphite as main ingredients with minor amounts of a complexing agent and the like) at 90° C. for 26 minutes to deposit a Ni—P plating in a thickness of 4.8 μm. After washing with water at room temperature for 3 minutes, the test piece was dried with blown air at room temperature for 2 minutes.

Thereafter, the test piece was transferred into a transparent electric oven and heat treated in a hydrogen atmosphere at 370° C. for 10 minutes to provide better plating adhesion.

In addition to measurement of its thickness, the plated coat was evaluated for peel (adhesion) strength by pulling up the tip of the loop of an Al wire (0.3 mm$^\Phi$) vertically after it was attached to the surface of the plated coat by ultrasonic bonding under the following conditions.

Apparatus: USW-20ZD60S-C, ultrasonic wire bonder of Ultrasonic Engineering Co., Ltd. for use on thick wires
Wire: TANW-SOFTII, Ni-containing Al wire of Tanaka Kikinzoku Kogyo K. K. with a diameter of 0.3 mm
Operation: Ultrasonic output, 2.0 W
Pressure: 400 g×0.5 sec The amount of Al dissolved in the palladium activator fluid was measured by ICP. The results obtained are shown in Table 1.

A tensile tester was used for tensile strength measurement and the upper limit of the range of measurement that could be made was 800 g. When the plated film did not separate, the adhesion strength was indicated as higher than 800 g.

For comparison, a tape peel test was also conducted using adhesive tape but no plating separation occurred.

TABLE 1

| | Test piece No. | pH | Plating thickness, μm | Failure mode | Adhesion Strength, g | Tape peel | Al dissolution mg/l |
|---|---|---|---|---|---|---|---|
| Example 1 | 1 | 2.0 | 4.8 | Break in loop or at neck | >800 | No | 8.8 |
| Example 2 | 2 | 3.0 | 5.2 | | >800 | No | 4.0 |
| Example 3 | 3 | 4.1 | 5.0 | | >800 | No | 2.3 |
| Comparative Example 1 | 4 | 7.7 | 5.0 | Plating separated or break occurred | 227 | No | <0.5 |
| Comparative Example 2 | 5 | 1.3 | 5.1 | | 160 | no | 55.0 |

EXAMPLE 2

Test piece No. 2 was pretreated as in Example 1 except that the palladium activator fluid was adjusted to a pH of 3.0. The test piece was then subjected to electroless Ni plating. It was measured for plating thickness, adhesion strength and the amount of Al dissolution and the results are shown in Table 1.

EXAMPLE 3

Test piece No. 3 was pretreated as in Example 1 except that the palladium activator fluid was adjusted to a pH of 4.1. The test piece was then subjected to electroless Ni plating. It was measured for plating thickness, adhesion strength and the amount of Al dissolution and the results are shown in Table 1.

Comparative Example 1

Test piece No. 4 was pretreated as in Example 1 except that the palladium activator fluid was adjusted to a pH of 7.7. The test piece was then subjected to electroless Ni plating. It was measured for plating thickness, adhesion strength and the amount of Al dissolution and the results are shown in Table 1.

Comparative Example 2

Test piece No. 5 was pretreated as in Example 1 except that the pH of the palladium activator fluid was not adjusted with a hydrogencarbonate but remained at 1.3. The test piece was then subjected to electroless Ni plating. It was measured for plating thickness, adhesion strength and the amount of Al dissolution and the results are shown in Table 1.

As is clear from Table 1, test piece Nos. 1–3 that were subjected to palladium activation with the fluids having the pH adjusted to lie within the acidic range of 2–5 suffered only limited dissolution of Al and allowed for the deposition of highly adherent Ni—P platings in the subsequent step of electroless Ni plating.

Test piece No. 4 which was subjected to palladium activation with the fluid having the pH adjusted to lie within the neutral range of 7–8 higher than 5 also suffered only limited dissolution of Al. However, the adhesion of the plating deposited on this test piece was poor because palladium was not adsorbed on it. Test piece No. 5 which was subjected to palladium activation with the fluid having a pH of less than 2 suffered extensive dissolution of Al, so the plating deposited on this test piece was not uniform and its adhesion was poor.

According to the present invention, composites of metallic materials such as Al and non-metallic materials such as ceramics can be plated with uniform and highly adherent layers of Ni and other metals in an efficient and economical manner. This offers an advantage when using the plated composites as materials of heat sinks on circuit boards since the composites can be efficiently soldered to the circuit boards and have better corrosion resistance.

What is claimed is:

1. A pretreating method before plating which comprises the steps of cleaning the surface of a composite of a metallic and a non-metallic material to be plated and performing a treatment for palladium activation with a palladium activator fluid at pH of 2–5.

2. The pretreating method according to claim 1, wherein said composite is a material for a heat sink on a circuit board.

3. The pretreating method according to claim 1 or 2, wherein the pH of said palladium activator fluid is adjusted with a hydrogencarbonate.

4. The pretreating method according to claim 1 or claim 2, wherein said plate is applied by electroless plating.

5. The pretreating method according to claim 3, wherein said plate is applied by electroless plating.

6. A composite of a metallic and a non-metallic material to which plating has been applied and the plated coat has a peel strength of at least 400 g in a wire-bond pull test with an aluminum wire as applied to said plated coat by ultrasonic bonding.

7. A composite of a metallic and a non-metallic material to which plating has been applied and the plated coat has a peel strength of at least 800 g in a wire-bond pull test with an aluminum wire as applied to said plated coat by ultrasonic bonding.

8. A composite of a metallic and a non-metallic material to which plating has been applied and the plated coat, if it is subjected to a wire-bond pull test with an aluminum wire as applied to it by ultrasonic bonding, has a failure mode which involves break either in the loop or at the neck of said aluminum wire.

9. The composite according to any one of claims 6–8, wherein said plating is applied by electroless plating.

10. The composite according to claim 9, wherein said plating is a Ni alloy plating.

11. The composite according to any one of claims 6–8, wherein a main component of said metallic material is Al, Mg, Cu or Fe and a main component of said non-metallic material is SiC, $Al_2O_3$, AlN or $Si_3N_4$.

12. The composite according to claim 9, wherein a main component of said metallic material is Al, Mg, Cu or Fe and a main component of said non-metallic material is SiC, $Al_2O_3$, AlN or $Si_3N_4$.

13. The composite according to claim 10, wherein a main component of said metallic material is Al, Mg, Cu or Fe and a main component of said non-metallic material is SiC, $Al_2O_3$, AlN or $Si_3N_4$.

14. The composite according to any one of claims 6–8, which is a material for a heat sink on a circuit board.

15. The composite according to claim 9, which is a material for a heat sink on a circuit board.

16. The composite according to claim 10, which is a material for a heat sink on a circuit board.

* * * * *